United States Patent
Achard et al.

[11] Patent Number: 6,112,976
[45] Date of Patent: Sep. 5, 2000

[54] METHOD OF MANUFACTURING WIRE SEGMENTS OF HOMOGENEOUS COMPOSITION

[75] Inventors: Louis-Marie Achard; Claude Blais; David Hirsch Danovitch; Jean-Francois Garneau, all of Granby; Michel Robert, Waterloo, all of Canada

[73] Assignee: International Business Machines Corporation, Armonk, N.Y.

[21] Appl. No.: 09/085,804

[22] Filed: May 27, 1998

[30] Foreign Application Priority Data

Aug. 7, 1997 [CA] Canada .................................. 2210063

[51] Int. Cl.⁷ .......................... B23K 35/12; H01R 9/00; H05K 3/00
[52] U.S. Cl. .......................... 228/254; 228/253; 29/843
[58] Field of Search .......................... 29/843, 825, 830; 174/68.5; 361/400, 403, 406; 228/180.21, 180.2, 253, 254, 56.3, 39, 123

[56] References Cited

U.S. PATENT DOCUMENTS

| | | | |
|---|---|---|---|
| 3,346,677 | 10/1967 | Kinsell | 75/339 |
| 3,652,235 | 3/1972 | Manilla et al. | 29/194 |
| 3,665,594 | 5/1972 | Raithel | 29/590 |
| 3,852,045 | 12/1974 | Wheeler et al. | 29/182 |
| 4,043,377 | 8/1977 | Mazdiyasni | 164/7 |
| 4,368,074 | 1/1983 | Otto, Jr. et al. | 419/51 |
| 4,527,731 | 7/1985 | Kent et al. | 228/180.2 |
| 4,914,814 | 4/1990 | Behun et al. | 29/843 |
| 5,244,143 | 9/1993 | Ference et al. | 228/180.21 |
| 5,268,018 | 12/1993 | Mourer et al. | 75/338 |
| 5,424,027 | 6/1995 | Eylon | 419/49 |
| 5,518,684 | 5/1996 | Pruitt | 419/66 |
| 5,718,361 | 2/1998 | Braun et al. | 228/56.3 |
| 5,718,367 | 2/1998 | Covell, II et al. | 228/254 |

FOREIGN PATENT DOCUMENTS 57-138198  8/1982  Japan .

*Primary Examiner*—Patrick Ryan
*Assistant Examiner*—Zidia T. Pittman
*Attorney, Agent, or Firm*—Tiffany L. Townsend

[57] ABSTRACT

The disclosed invention provides for a method of manufacturing solder columns for particular use in attaching substrates to a printed circuit board. The method results in columns of homogeneous composition and thus overcomes problems associated with the phenomena of segregation. The method includes the steps of forming particles of the metal composition to be used for the columns from a molten source of the composition. The solid particles are then formed into segments of homogeneous composition by drawing ingots of the composition into wire and severing the wire into segments.

13 Claims, 2 Drawing Sheets

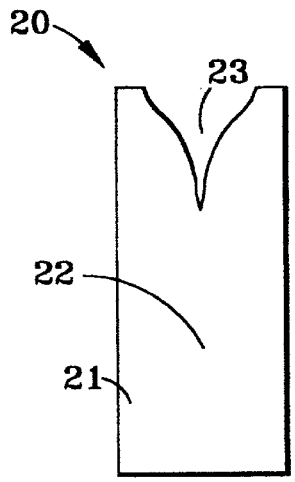
FIG. 2
PRIOR ART
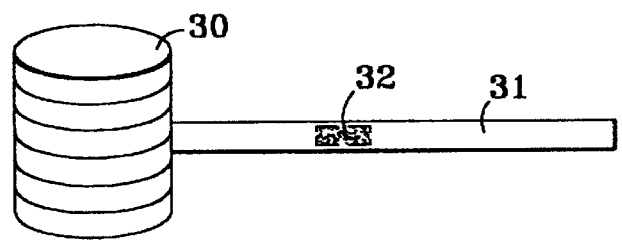
FIG. 3
PRIOR ART
FIG. 4
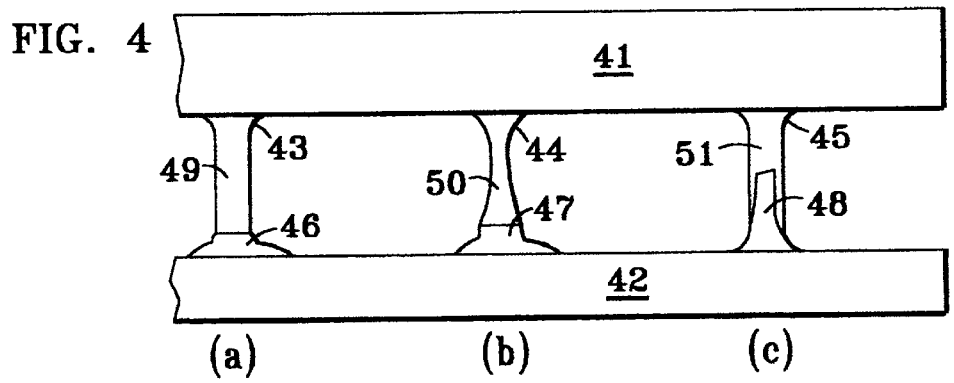
FIG. 5
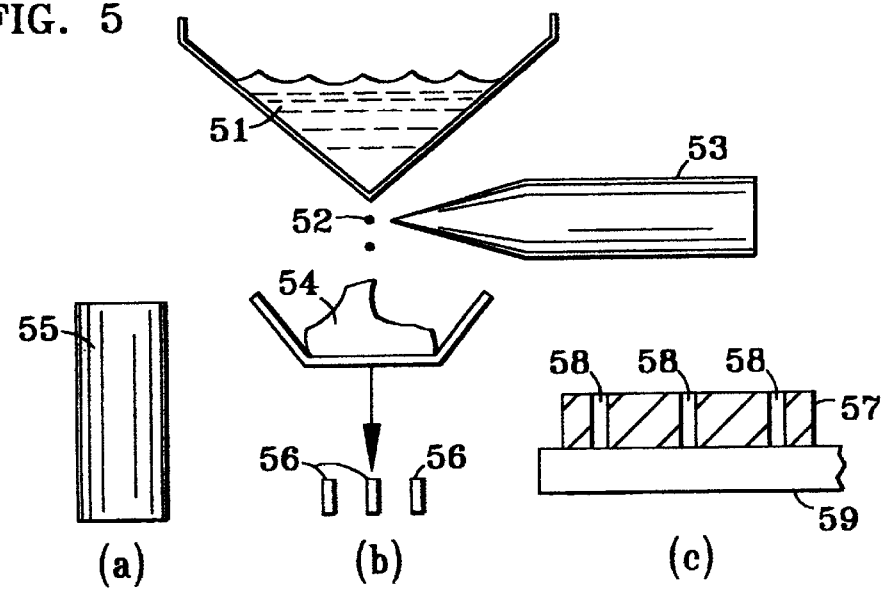

METHOD OF MANUFACTURING WIRE SEGMENTS OF HOMOGENEOUS COMPOSITION

FIELD OF THE INVENTION

The present invention relates to methods of manufacturing metal segments where such segments are of homogeneous composition. More particularly, the invention relates to the manufacture of solder columns for use in providing electrical connections for the packaging and assembly of components in the semiconductor and integrated circuit electronic industry.

DESCRIPTION OF PRIOR ART

Solder connections have been used extensively in circuit board assemblies and electronic card devices to provide electrical interconnections, to bond components together, and to mount components on substrates for carrying integrated circuit devices. With the trend in electronics packaging and circuitry assemblies to higher functionality and complexity, there is a significant increase in the required number of interconnections. While development continues to miniaturize interconnection size and pitch, the rate of increase in package complexity often occurs at such a rapid rate that package miniaturization cannot keep pace and therefore some package sizes must actually be increased. However, where device package sizes are decreased, the number of input/output leads typically increases, the size of individual interconnections and the spacing between adjacent contacts must be reduced, resulting in potential difficulties in positioning and securing the devices on mounting pads on the surface of circuit boards, circuit cards and the like.

Several alternative known arrangements exist for connecting the substrate/carrier, for example for chip devices, to a printed circuit board (PCB). One such alternative is a pin grid array attachment where the actual connecting elements are typically pins of rigid metallic material, for example copper or Kovar. Here, placement to the PCB is effected by insetting the pins into receiving thru-holes in the PCB. Another more recently developed arrangement is ball grid array (BGA) attachment where the connecting elements are typically balls of solder material. This arrangement has gained considerable acceptance in the industry due to the fact that placement onto the PCB is effected by metallurgically joining the balls to surface pads on the PCB. This provides design flexibility and cost reductions to the PCB in that (1) the thru-holes are no longer required for substrate connection and (2) this placement technique is compatible with Surface Mount Technology (SMT) processes used for placement of other components on the card.

The use of this BGA attachment arrangement requires that attention be paid to relative coefficients of thermal expansion (CTE) of the substrate versus the PCB, in that differences in rates of thermal expansion can disturb the metallurgical joint during normal operation and use of the substrate-PCB assembly. In the case of a ceramic substrate, the difference in CTE can be significant. The larger the ceramic substrate, the more critical this CTE difference becomes to the integrity of BGA metallurgical joints.

The provision of solder column connections is a new emerging technology to meet the needs of the electronic packaging industry resulting from the aforementioned potential need for larger ceramic substrates combined with the desire to exploit the surface-mountable advantages of a solder connect technology such as BGA. Replacing the surface mountable solder balls with solder columns increases the aspect ratio of each solder connection and consequently reduces the impact of CTE mismatch on the integrity of the solder connections. It is this ceramic column grid array (CCGA) technology to which the preferred embodiment of the subject invention, which will be subsequently described, is particularly related.

Other documents that may be referred to in order to obtain a better understanding of CCGA technology include:

Master, R. et al, "*Ceramic Column Grid Array for Flip Chip Applications*", Proceedings-Electronic Components and Technology Conference 1995, IEEE, Piscataway, N.J., USA, 95CH35820, pp 925–929.

Tummala, R. & Rymaszewski, "*Microelectronics Packaging Handbook*", Van Nostrand, 1989.

Many disparate technologies presently exist and are known which relate to some aspects of the subject matter of the present invention. These include the manufacture of powdered metals, the production of a spray of atomized metal droplets, injection molding for forming solder contacts, the use of powdered metal in the molding of electrical contacts and conductive devices, as will now be more particularly referred to in exemplary prior art documents.

U.S. Pat. No. 3,346,677, entitled "Manufacture of Powdered Lead", issued Oct. 10, 1967 and assigned to St. Joseph Lead Company, New York, describes the manufacture of powdered lead by atomizing a stream of molten lead via a jet of compressed air. The patent indicates that it is desirable to have lead oxide distributed throughout the mass of powder. The resulting stream of molten particles of lead is subjected to heat and thus substantially all of the lead oxide is present as a coating of extremely fine particles on coarser particles of lead which have not been completely converted into lead oxide.

U.S. Pat. No. 4,914,814, issued to International Business Machines Corporation on Apr. 10, 1990 and entitled "Process of Fabricating a Circuit Package", describes a process which includes the step of filling an array of pin holes in a pin mold with solder in which the array of pin holes is in registration with an array of conductive pads on one side of a chip carrier. The mold is heated and an array of pins is thus bonded to the array of conductive pads. The free end of the array of pins is bonded to a circuit board.

U.S. Pat. No. 5,268,018, entitled "Control Process for the Production of a Spray of Atomized Metal Droplets", issued to General Electric Company on Dec. 7, 1993. This patent describes creating molten metal droplets by atomizing a stream of liquid metal to form a spray of molten metal particles. A variety of mechanisms are described for varying the characteristics of the metal spray. The spray is ultimately used in the coating of articles.

U.S. Pat. No. 5,244,143, entitled "Apparatus and Method for Injection Molding Solder and Applications Thereof", issued to International Business Machines Corporation on Sep. 14, 1993. This invention could be used in the creation of solder mounds on electrical devices to form contacts thereon in which molten solder is injected under pressure. Various shapes and sizes of contact pads can be formed including what are referred to as C4 connections.

U.S. Pat. No. 5,518,684, issued to National Semiconductor Corporation on May 21, 1996 and is entitled "Method of Making a Molded Lead Frame". The subject matter relates to integrated circuit packaging and in particular, provides for a lead frame made from molding electrically conductive material, such as powdered copper metal, into a desired lead frame shape. This is an alternative process of making lead frames to stamping and etching processes that are presently prevalent in the making of lead frames.

None of these references provide solutions to the problems addressed by the subject invention. In particular, the preferred embodiment of the present invention provides for the manufacture of high lead content solder column segments of consistent composition and eliminating the segregation of the lead and tin components of the solder at the source. The invention further provides for eliminating the costs and risks associated with sorting and identifying column segments of inappropriate solder composition, and in the worst case, disassembling electrical components or packages which have already been mounted on circuit boards.

SUMMARY OF THE INVENTION

It is one object of the invention to manufacture metal segments where each segment is of essentially the identical homogeneous composition.

It is another object of the invention to provide significant improvements to the electronic packaging technology which makes use of solder column connections.

It is a further object of the invention to provide homogeneous solder segments for use as solder column connections and particularly for use in ceramic column grid array (CCGA) microelectronic applications.

According to one aspect of the invention, there is provided a method of manufacturing individual segments of metal composition having more than one component in which the components are of a desired proportion in the composition. The method comprises the steps of providing a molten source of said metal composition, forming particles of said metal composition from said molten source such that each particle comprises said components in essentially the desired proportion and forming said solid particles into segments such that all regions of each segment effectively consist of metal of the desired proportion of components, thereby resulting in segments of homogeneous composition.

According to another aspect of the invention, there is a provided a method of fabricating a plurality of column connections of homogeneous segments to an array of pads on a circuit board in which each segment consists of a composition of metal having more than one component in which the components are of a desired proportion. The method comprises the steps of providing a molten source of said metal composition; forming solid particles of said metal composition from said molten source such that each particle comprises said components in the desired proportion; forming said columns by adding said solid particles to a mold having an array of cavities to form said columns such that the array of cavities is in substantial registration with the array of pads on said circuit board; and heating said mold to melt the solid particles in the cavities and to attach each column to a respective pad on the circuit board.

BRIEF DESCRIPTION OF THE DRAWINGS

A preferred embodiment of the present invention will be described, by way of example only, with reference to the accompanying drawings, in which:

FIG. 2 is an image of a typical cast lead/tin alloy ingot;

FIG. 3 is a pictorial drawing of a typical lead/tin wire segment;

FIG. 4 is an image of various electrical connections between a substrate and a circuit card;

FIG. 5 is a pictorial representation of various processes which could be incorporated in the subject invention.

PROBLEMS ADDRESSED BY THE SUBJECT INVENTION

Figure 1:
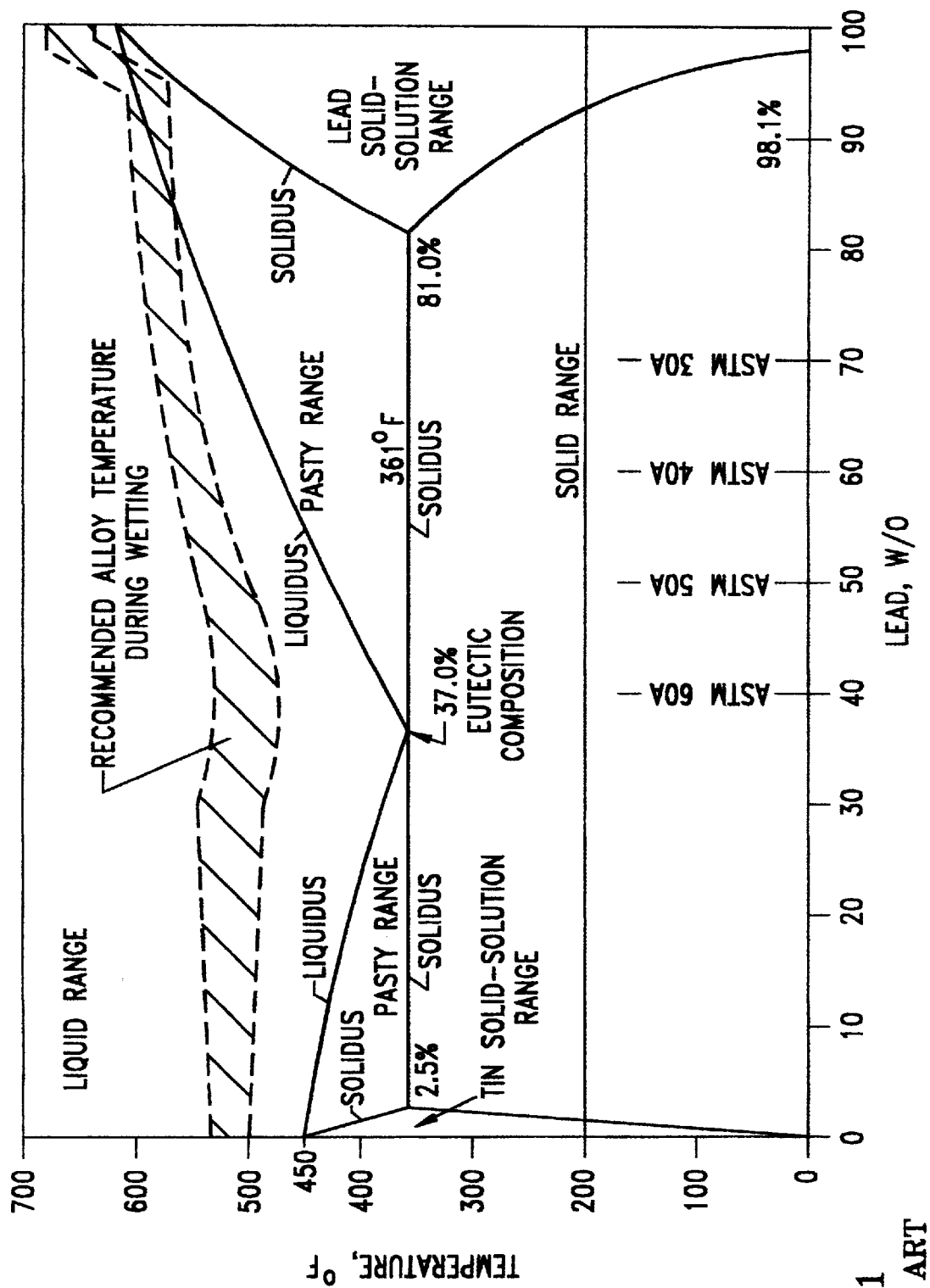
FIG. 1 is a typical lead/tin (Pb/Sn) alloy phase diagram.

The common practice for manufacturing high Pb solder wire (e.g. about 90% by weight of Pb and about 10% by weight of Sn) consists of casting molten solder of the desired composition into ingots of dimensions suitable for subsequent wire drawing. In connecting components, including CCGA components, to a PCB using SMT processes, the solder typically used to effect the metallurgical connection of the lead, ball or column is eutectic Pb/Sn (37/63) solder. A solder column of high Pb content has a higher melting point than the eutectic solder and therefore will not melt and collapse when the eutectic solder is heated to its molten state for effecting the metallurgical connection. It is important that the solder column does not collapse in order that it maintain its intended aspect ratio and thus serve its intended purpose of minimizing the impact of CTE mismatch on solder connection integrity. Additionally, the higher Pb content solder has inherently higher fatigue properties than eutectic Pb—Sn solder.

Inherent in this common process is the undesirable segregation of the individual component elements of lead (Pb) and tin (Sn) during the solidification of the molten solder into its ingot form. This segregation will be described with reference to FIG. 1, which is a typical Pb/Sn alloy phase diagram as appears in "Solders and Soldering", Howard J Manko, 2nd Edition, page 56, FIG. 3.8, McGraw-Hill, 1979. In referring to FIG. 1, it can be seen that as a high Pb percentage alloy in liquidus state is cooled, it enters what is referred to as a "pasty range", with 90/10 Pb/Sn, for example, this range occurs between 590° F. and 495° F. In this range the natural tendency is to begin solidification by means of forming a lead solid solution (shown at the right portion of the diagram in FIG. 1). At any given temperature within the pasty range of a given alloy composition, this lead solid solution has a higher Pb content than the original liquid alloy. It follows that the unsolidified liquid at the same temperature contains a lower Pb content than the given alloy. This progression continues until the temperature of full solid solution is obtained. The final region of the ingot to solidify will consequently tend, depending upon exact ingot dimensions and cooling conditions, to contain a higher amount of Sn than the proportion of tin in the original bulk melt composition. This phenomenon is known as "segregation". The region of this segregation within the ingot will also vary depending upon dimensions and cooling. The phenomena results in an ingot which has non-uniform distribution of lead and tin.

FIG. 2 shows a typical cast Pb/Sn alloy ingot 20 illustrating the results of segregation, as described, and showing shrinkage (due to the lower volume of the alloy in its solid state compared to its liquid state) and heat distribution, where the hotter center will solidify last and thus tend to contain the highest Sn content. The outer regions 21 of ingot 20 solidify first and have a higher percentage content of Pb while the inner regions 22 will solidify later and have a higher percentage of Sn, when compared with the composition of the original melt. Thus, the ingot is not of uniform composition. Shrinkage is depicted in ingot 20 by means of the cone-like cavity 23 such that the location of the apex of the cavity points to the region of last solidification, thus illustrating a typical solidification of the molten composition into ingot form.

Once ingot 20 is drawn into wire, the region of higher Sn content 22 will manifest itself as a wire segment somewhere within the total wire length in a spool drawn from the aforementioned ingot 20 with higher Sn content. This is exemplified in FIG. 3 which shows a spool of wire 30, drawn from ingot 20 with an individual wire 31 shown pulled off of spool 30. The wire is not of uniform-composition as shown by shading 32 which is a region or segment in wire 31 of high Sn content.

The presence of such higher Sn content wire segments in the high Pb solder wire may be acceptable in many traditional soldering applications. However, in ceramic column grid array (CCGA) microelectronic applications, for example, this phenomenon can be catastrophic. The solder wire, 31 in FIG. 3 for example, which is typically 0.020" in diameter, is severed into small segments of, for example, 0.140" in length, each serving, for example, as an electrical interconnection between pads or contacts on a substrate and a system card. It is not uncommon to have 1000 such column segments on an individual ceramic substrate and the requirement trend is to have this number increased. In order to maintain the aspect ratio of each column segment (aspect ratio refers to the height to diameter ratio of the column segment where ratios of 4 to 6 are common but ratios certainly vary outside of this range), and thus alleviate the effects of thermal fatigue resulting from different coefficients of thermal expansion and mismatch between a substrate and a card, the attachment of the substrate to the card by means of the column segments must be effected at a temperature below the melting point of the high Pb alloy of the column segment. This is accomplished by utilizing a lower melting eutectic solder in the contact pads on the card such that, when reflowed above its melting temperature, the eutectic solder will effectively join the high Pb solder segments to the card.

FIG. 4 illustrates the connecting of a substrate 41 which could carry numerous integrated circuit devices or chips packaged on the top surface thereof, by well known techniques, to a circuit card 42. As is well known, the devices mounted on the top of substrate 41 are interconnected by means of conducting vias within the substrate to contact points 43, 44 and 45 on the underside of substrate 41. Of course it is understood that this drawing is simply an example to illustrate aspects of the invention, and in practice, many more contacts than shown would be involved. Respective contact points on the substrate 41 (43, 44 and 45) and on the card 42 (46, 47 and 48) are interconnected with solder columns 49, 50 and 51. Portion (a) of FIG. 4 shows the effective and desirable connection by a high Pb solder column 49 to the eutectic solder contact pad 46 on card 42.

As has been described above, in view of the non-uniformity of the wire composition, some presently available wire segments will have higher percentage of Sn in the column segments and thus a lower melting point than does the desired Pb/Sn column (typically 90%/10%) segments. The presence of such segments has been observed in production, and are detected as defects in substrate-to-card attachments, where the substrate, containing one or more silicon chips (typically several) is expensive. Further, since the substrate with chips mounted thereon is often the end-product which is provided to customers who subsequently perform the card attach operation, the segment defects can be detrimental to the reputation of the manufacturer of the column containing substrate. In contrast to the normal and acceptable column attach as shown at (a) in FIG. 4, defects with presently available non-homogeneous columns manifest themselves as two main categories:

1. With lower melting points, the higher percentage of Sn column segments 50 tend to "neck down" into an hour-glass shape as shown at (b) in FIG. 4. Since mechanical stress wilt be concentrated in the column at the region of reduced diameter, this resulting shape has a lower thermal fatigue resistance than the desirable standard column 49 as shown and described with respect to, (a) in FIG. 4.

2. The higher percentage Sn column segments 51 tend to "wick up" the eutectic solder from the column-board interface, creating poor or missing contact fillets 48 to which the solder column 51 is intended to be connected as shown at (c) in FIG. 4, resulting in a potentially defective electrical connection to card 42.

Solder wire having Sn composition content ranging all the way up to eutectic (63% by weight of Sn) has been observed, with the aforementioned defects beginning to occur in columns of Sn content equal or greater than about 30% by weight of Sn. Thus, a non-eutectic solder composition having Sn in the range of about 10% to 30% by weight is considered to be the preferred composition for practicing the invention. Given the large number of column segments required per substrate, a low level of defects (5 parts per million, for example), within the column segment population can cause as high as a 1% defective substrate situation, which is unacceptable.

DETAILED DESCRIPTION OF THE PREFERRED EMBODIMENT

The solution to the above described problems as has been described with reference to (b) and (c) of FIG. 4, incorporates the combination of known powder metallurgy principles with the requirements of homogeneous high Pb content solder. Reference to such known powder metallurgy principles are found in the following references:

Hirschhorn, J, "*Introduction to Powder Metallurgy*", American Powder Metallurgy Institute, 1969.

Jones, W., "*Fundamental Properties of Powder Metallurgy*", Edward Arnold (Publishers) Ltd, London, 1960.

One method for creating powder metal alloys for the present application involves the melting of the solder alloy of lead and tin in the desired composition, then passing the molten material through an atomizer such that said molten material solidifies as fine particles or powder. This is illustrated in FIG. 5 where a molten source 51 of the high lead content solder of desired composition is passed as molten droplets 52 by the nozzle of atomizer 53 where the droplets 52 are solidified in particles 54. Providing a source of the required molten solder and forming particles by use of atomizing techniques are well known to those skilled in these respective technologies.

This particular known general method of powder metal production is extended to high Pb solder material, where the formed particles 54 of Pb/Sn material are of sufficiently small dimension compared to the dimension of a column segment, such that any segregation as previously described within individual particles 54 caused by cooling will not cause a resulting column segment to vary in Sn content from one part or segment of the column to another. Such particle dimensions appropriate for column segments of interest here (for example, column segments of about 0.4–0.6 mm diameter and 1.9–3.6 mm height) would typically fall in the range of −325+500 US mesh, or about 20–40 microns diameter.

It has been found to be beneficial to practice current powder metallurgy methods for reasons of physical attributes of the resulting fine grain microstructure and small particle size. The subject invention effectively extends this technology to solder segment segregation elimination with surprisingly beneficial results. In other words, any segregation of the Pb and Sn components which may occur will only do so at the particle or microscopic level. This does not affect the overall distribution of the components in any resultant segment of wire made from those particles. In this sense each resulting segment of solder wire or column is considered to have a homogeneous composition, and each column segment has essentially the same composition as all other column segments.

With each and every particle of solder 54 having the desirable proportion or composition of the Pb and Sn, then it follows that a larger mass of the powder would also have the desirable proportion of Pb and Sn. Thus, a mass of powder 54 would be homogenous in that the composition would be of a uniform nature throughout. Once this is appreciated, the problem of segregation of components of the solder in column segments as previously described, no longer exists. Once the principle is realized that a mass of the powder is homogeneous, the powder 54 can then be processed to make the required columns of solder. This can be done in a variety of ways.

With reference again to FIG. 5, in one embodiment illustrated at (a), the Pb/Sn alloy powder 54 is pressed at an elevated temperature (but below the melting point of said alloy) to form an ingot 55 of suitable dimension. Temperatures and pressures used will depend upon the specific equipment set and process used by the powder metal ingot manufacturer. This ingot can then be subsequently drawn into wire and cut or severed into appropriate segments by well known procedures. The pressure and temperature involved necessary to form ingot 55 and to subsequently draw the ingot into wire are well known to those skilled in these technologies.

An alternative to forming an actual ingot is to compress and heat the powder as an in-situ operation for wire drawing. In this particular embodiment, the process for ingot manufacture previously described would occur in the presence of a wire drawing extrusion die such that the temperature and pressure applied serves the dual purpose of forming the ingot and forcing the ingot through the extrusion die.

A further alternative is to compress and heat the powder 54 in molds in order to form the actual powder metal alloy column segments 56 without any intermediate steps as shown at (b) in FIG. 5. In this particular embodiment, the powder is placed in a mold of suitable material containing blind (ie, open at one end only) columnar holes. The mold filled with powder is subsequently heated (for example, but not limited to, 75° to 100° C.) while pistons in an arrangement corresponding to the arrangement of columnar holes are inserted into said columnar holes with sufficient pressure to compress the powder and form the column segments 56. This embodiment has the further advantage of eliminating the need for wire drawing and cutting as required for the embodiment in (a) of FIG. 5.

Yet a further embodiment is to form solder columns onto a substrate directly from the alloy metal powder 54. In this embodiment, the powder particle size needs to be controlled so that the powder density is consistent at volumes approaching that of a solder column in (c) of FIG. 5. A mold 57 of suitable material, containing columnar cavities 58 similar to that used for solid solder column segments, is placed over the pre-fluxed substrate 59, with columnar cavities aligned over substrate pads similar to that practiced with solid solder column segments as described for FIG. 4. The cavities of the mold would subsequently be filled with the solder alloy powder 54. The height of the cavities 58 would be greater than that used for solid solder segments in order to account for the lower density, albeit consistent composition, of the powder compared to solder in solid form. The mold-substrate-powder assembly is then passed through a solder reflow cycle (much as practiced with solid solder segments), allowing the powder 54 in cavities 58 to melt and then solidify as attachments to the substrate 59 of the solder column of consistent size, given the consistent density of the powder. This embodiment has the additional advantages over the previously described embodiments of not only eliminating the need for wire drawing and cutting, but also eliminating the need for compressing/heating/forming of the powder into ingots.

As is apparent, these described inventive processes are practical alternatives to current methods of forming solder columns with the accompanying problems as previously described. These processes provide distinct advantages in that the elimination of solder segregation is done at the source of the problem, thereby eliminating the costs of disassembling and refabricating components that have already been connected. In addition, the risks and costs of sorting and attempting to identify solder columns having regions or segments having a higher than desirable tin content are eliminated.

Although it is apparent that specific preferred embodiments of methods of manufacturing solder wire segments or solder columns of homogenous composition and the attachment of the resulting columns to a substrate or card has been described, it will be apparent to those skilled in the art that many alternatives to the described embodiments may be used without digressing from the spirit of the disclosed invention.

The embodiments of the invention in which an exclusive property is claimed are defined as follows:

1. A method of forming at least one segment of metal, the metal having more than one component, comprising the steps of:
   molding a powder of a substantially homogeneous non-eutectic metal composition in a mold containing holes;
   heating the mold to a temperature significantly less than the melting point of the powder;
   compressing the powder in the mold.

2. The method according to claim 1 wherein the temperature is at least about 75° C. and at most about 100° C.

3. The method according to claim 1 wherein the holes are columnar.

4. The method according to claim 1 wherein the metal composition is about 90% by weight lead and 10% by weight tin.

5. A method of forming at least one segment of metal, the metal having more than one component, comprising the steps of:
   pressing a powder of a substantially homogeneous non-eutectic metal composition into a predefined shape;
   heating the shaped powder to a temperature significantly less than the melting point of the powder.

6. The method according to claim 5 wherein the temperature is at least about 75° C. and at most about 100° C.

7. The method according to claim 5 wherein the predefined shape is columnar.

8. The method according to claim 5 wherein the metal composition is about 90% by weight lead and 10% by weight tin.

9. The method according to claim 5 wherein the shape is an ingot.

10. The method according to claim 5 wherein the metal is heated prior to pressing.

11. The method according to claim 9 further comprising the steps of drawing the ingot into a wire.

12. The method according to claim 11 wherein the metal is heated to a temperature substantially less than the melting point while being drawn.

13. The method according claim 11 wherein the drawn ingot is divided into segments.

* * * * *